United States Patent
Anorozo

(10) Patent No.: US 8,258,987 B2
(45) Date of Patent: Sep. 4, 2012

(54) ICON ILLUMINATION FOR CAPACITIVE TOUCH SWITCH

(75) Inventor: Benedito G. Anorozo, Joinville (BR)

(73) Assignee: Whirlpool Corporation, Benton Harbor, MI (US)

(*) Notice: Subject to any disclaimer, the term of this patent is extended or adjusted under 35 U.S.C. 154(b) by 496 days.

(21) Appl. No.: 12/638,322

(22) Filed: Dec. 15, 2009

(65) Prior Publication Data

US 2011/0140935 A1 Jun. 16, 2011

(51) Int. Cl.
*H03M 11/00* (2006.01)
*H03K 17/96* (2006.01)

(52) U.S. Cl. ............ 341/33; 200/600; 200/314; 362/95; 362/394

(58) Field of Classification Search ............ 341/33; 200/600, 313, 314; 362/95, 249.04, 394, 362/631
See application file for complete search history.

(56) References Cited

U.S. PATENT DOCUMENTS

| | | | |
|---|---|---|---|
| 6,677,707 B1 | 1/2004 | Dietiker | |
| 8,182,104 B2 * | 5/2012 | Reinker | 362/97.1 |
| 2007/0068789 A1 * | 3/2007 | Streifler | 200/600 |
| 2007/0091242 A1 | 4/2007 | Oohira | |
| 2007/0206124 A1 | 9/2007 | Lee | |
| 2009/0050454 A1 * | 2/2009 | Matsukawa et al. | 200/313 |
| 2009/0090605 A1 | 4/2009 | Arione et al. | |
| 2009/0090611 A1 | 4/2009 | Zeijlon et al. | |
| 2009/0091906 A1 | 4/2009 | Arione et al. | |

FOREIGN PATENT DOCUMENTS

| | | |
|---|---|---|
| EP | 0974785 A1 | 1/2000 |
| EP | 1924000 A2 | 5/2008 |
| EP | 2048779 A1 | 4/2009 |
| JP | 08146229 A | 6/1996 |
| JP | 2000122564 A | 4/2000 |
| JP | 2007264571 A | 10/2007 |
| JP | 2009008941 A | 1/2009 |
| WO | 2006066636 A1 | 6/2006 |
| WO | 2008046188 A1 | 4/2008 |

OTHER PUBLICATIONS

European Patent Office Search Report, April 6, 2011.

* cited by examiner

*Primary Examiner* — Howard Williams
(74) *Attorney, Agent, or Firm* — Jason S. Burnette; Barnes & Thornburg, LLP

(57) ABSTRACT

A capacitive touch switch is disclosed which includes a substrate having a channel formed between a first surface and a second surface thereof, thereby defining a flexible section of the substrate. The capacitive touch switch also includes an insulating panel having a first face and a second face, the second face adapted to be touched by a user. The capacitive touch switch may further include a capacitive electrode disposed on the flexible section, a light source coupled to the first surface of the flexible section, and one or more spacers secured to the first surface of the flexible section. Either the light source or the one or more spacers cause the flexible section of the substrate to be deflected away from the insulating panel when the substrate and the insulating panel are urged into contact. Deflection of the flexible section creates a gap which allows the light source to illuminate an icon disposed on the insulating panel. A method of manufacturing a capacitive touch switch is also disclosed.

20 Claims, 3 Drawing Sheets

ICON ILLUMINATION FOR CAPACITIVE TOUCH SWITCH

TECHNICAL FIELD

The present disclosure relates generally to a capacitive touch switch which may be utilized in the user controls of domestic appliances or any other devices which employ low-profile user controls. More particularly, the present disclosure relates to a low-profile capacitive touch switch having an illuminated icon.

BACKGROUND

Capacitive touch switches may be incorporated into the user controls of devices such as domestic appliances (for example, ovens, microwaves, dishwashers, etcetera) to replace traditional buttons and to provide a low-profile user interface. In the present disclosure, the term "capacitive touch switch," or "switch," refers to any type of sensor which detects the proximity or position of a user (typically, a user's finger) via a change in the capacitance of one or more electrodes. Several capacitive touch switches may be arranged along a panel, along with associated control circuitry, to form a user interface. Each switch may be associated with an icon disposed on the panel.

Visual feedback regarding the status or activation of a particular capacitive touch switch may be provided to a user by selectively illuminating an icon associated with the switch. By way of example, an icon may be semi-transparent, and a light source associated with the icon may cause light to shine through portions of the icon. Where several capacitive touch switches and light sources are arranged in a user interface, optical interference should be avoided to ensure illumination of only the desired icon(s). Opaque walls, septums, or light guides may be used for this purpose but increase the physical dimensions, cost, and manufacturing complexity of the capacitive touch switches and the user interface.

SUMMARY

According to one aspect, a capacitive touch switch may include a substrate having a first surface and a second surface. The substrate may include a channel which extends between the first and second surfaces and defines a flexible section of the substrate. The switch may also include a capacitive electrode disposed on the flexible section of the substrate. An insulating panel may be secured to a portion of the first surface of the substrate. The insulating panel may have an icon disposed thereon in proximity to the capacitive electrode. The switch may also include a light source coupled to the first surface of the flexible section of the substrate and engaged with the insulating panel such that the flexible section of the substrate is deflected away from the insulating panel.

In some embodiments of the capacitive touch switch, the substrate may comprise a printed circuit board. The printed circuit board may have a thickness of 1 millimeter or less. The capacitive touch switch may further include a control circuit coupled to the second surface of the substrate which is electrically connected to both the capacitive electrode and the light source. In some embodiments, the light source may be a light-emitting diode. In other embodiments, the light source may be a plurality of light-emitting diodes.

In some embodiments, the capacitive electrode is disposed on the first surface of the flexible section of the substrate. In these embodiments of the capacitive touch switch, a reflective material may at least partially cover the capacitive electrode. The reflective material may include a paint. In other embodiments, the flexible section of the substrate may have the shape of an N-sided polygon. In such embodiments, the channel which defines the flexible section traces N−1 sides of the polygon. In still other embodiments, the flexible section of the substrate may have at least a first width and a second width, where the second width is larger and nearer to the light source than the first width.

According to another aspect, a method of manufacturing a capacitive touch switch may include aligning an insulating panel and a substrate. The insulating panel may have a first face and a second face, where the second face is adapted to be touched by a user. The substrate may have a channel formed between a first surface and a second surface of the substrate. The channel may define a flexible section of the substrate. The method may further include urging the first face of the insulating panel into contact with a portion of the first surface of the substrate. This contact results in the flexible section of the substrate being deflected away from the insulating panel.

In some embodiments of the method, aligning the insulating panel and the substrate may include bringing an icon disposed on the insulating panel into alignment with a capacitive electrode disposed on the flexible section of the substrate. In other embodiments, the method may further include applying a reflective material to at least partially cover a capacitive electrode disposed on the first surface of the flexible section of the substrate. In some embodiments of the method, one or more light sources coupled to the first surface of the flexible section of the substrate may cause the flexible section to be deflected away from the insulating panel when the first face of the insulating panel is urged into contact with a portion of the first surface of the substrate. In other embodiments, one or more spacers coupled to the first surface of the flexible section of the substrate may cause the flexible section to be deflected away from the insulating panel when the first face of the insulating panel is urged into contact with a portion of the first surface of the substrate.

According to yet another aspect, a capacitive touch switch may include a printed circuit board having a channel formed therein. The channel may extend through the thickness of the printed circuit board and define a flexible pad in the printed circuit board. The switch may also include a capacitive electrode printed on the flexible pad, at least one light-emitting diode soldered to the flexible pad, and at least one spacer secured to the flexible pad. The switch may further include a glass pane having an icon serigraphy. The glass pane may be secured to a portion of the printed circuit board. The at least one spacer may extend further above the flexible pad than the at least one light-emitting diode such that the flexible pad is deflected away from the glass pane by the at least one spacer.

In some embodiments, the thickness of the printed circuit board may be 1 millimeter or less. In other embodiments, the switch may further include a layer of paint at least partially covering the capacitive electrode. The layer of paint may be capable of reflecting light produced by the light-emitting diode. In still other embodiments of the capacitive touch switch, the channel may border each side of the flexible pad except at a first end. In such embodiments, the at least one spacer may be located near a second end of the flexible pad, opposite the first end of the flexible pad.

BRIEF DESCRIPTION OF THE DRAWINGS

The detailed description particularly refers to the following figures, in which.

DETAILED DESCRIPTION OF THE DRAWINGS

Figure 1:
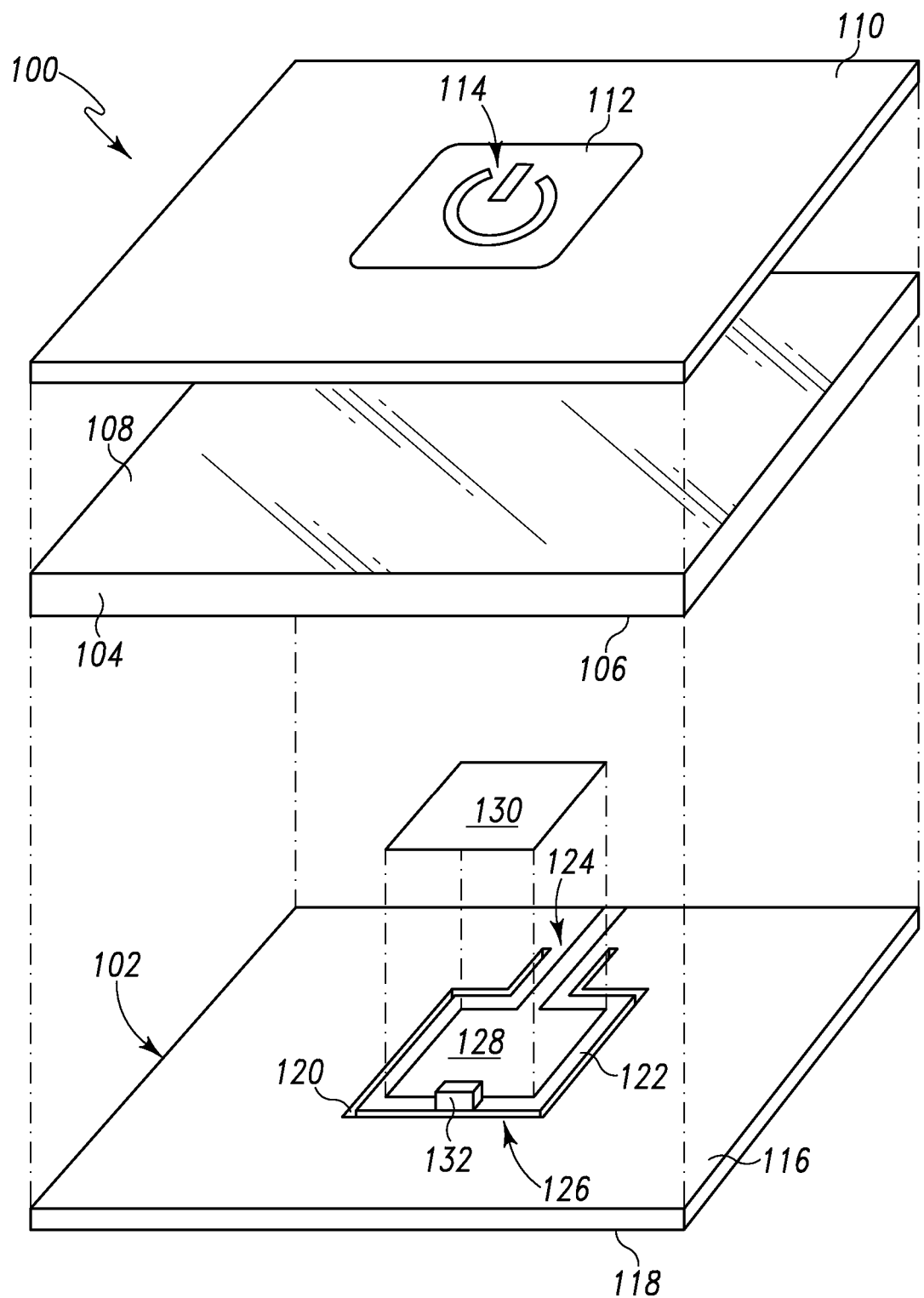
FIG. 1 is an exploded view of one embodiment of a capacitive touch switch.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the invention as defined by the appended claims.

Figure 2:
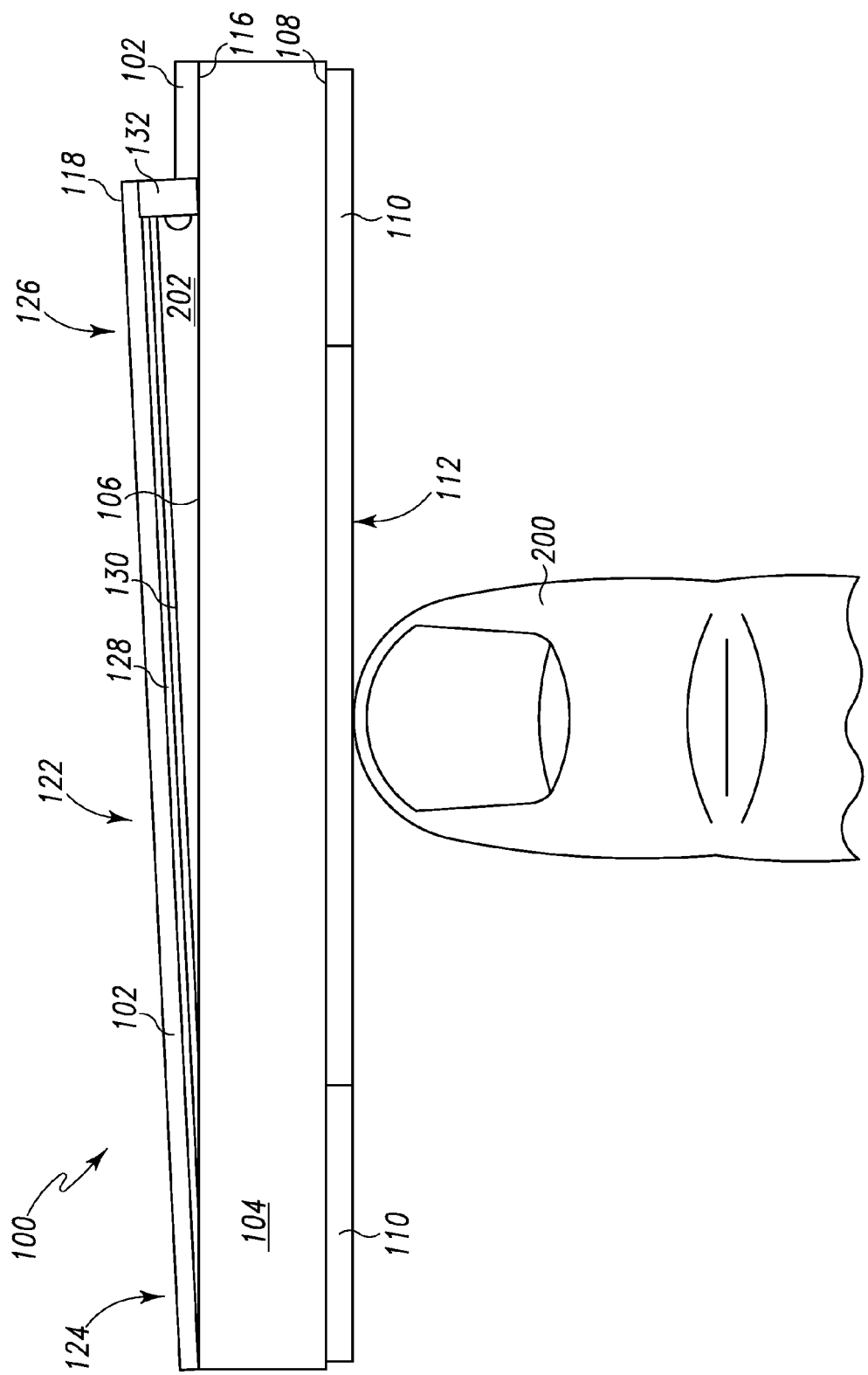
FIG. 2 is a cross-sectional view of an assembled capacitive touch switch according to the embodiment of FIG. 1.

The present disclosure relates to the structural arrangement of a capacitive touch switch that allows a reduction of the physical dimensions of the switch, a simplification of the manufacturing and mounting process, and a savings in cost. Referring now to FIGS. 1 and 2, there is shown a capacitive touch switch 100. The exploded view of the capacitive touch switch 100 in FIG. 1 illustrates a pre-assembly view of the components which are combined during manufacture of the switch. The cross-sectional, side view of FIG. 2 illustrates these same components in an assembled form. The components are labeled using the same reference numerals as FIG. 1, and similar components are labeled using similar reference numerals in all figures throughout this disclosure.

Two of the primary components of the capacitive touch switch 100 are a substrate 102 and an insulating panel 104. The insulating panel 104 serves as a dielectric material between the user 200 and a capacitive electrode 128. The insulating panel 104 may be formed of any non-conductive material, such as plastic, glass, ceramic, or some combination thereof and is typically formed of a transparent or semi-transparent material. The insulating panel 104 includes a first face 106 and an opposing, second face 108. In the embodiment shown in FIGS. 1 and 2, the insulating panel 104 is illustratively embodied as a glass pane 104, and the second face 108 is adapted to be touched by a user 200.

The second face 108 of the glass pane 104 may have a generally opaque cover 110 which serves to filter light passing through the generally transparent glass pane 104. This cover 110 may be illustratively embodied as a thin film 110 disposed on the glass pane 104. A semi-transparent area 112 of the thin film 110 is provided with an appropriately shaped icon 114 (e.g., a power on/off symbol). This semi-transparent area 112 filters light to display the icon 114 to a user 200 when the semi-transparent area 112 is backlit. Use of the thin film 110 may improve the adaptability of a user interface incorporating the capacitive touch switch 100. For example, it is possible to easily customize the user interface for different countries and languages by changing only the thin film 110. Those of ordinary skill will appreciate that the film 110 might also be disposed on the first face 106, rather than the second face 108, of the glass pane 104. Alternatively, the appropriate icons might be screen-printed directly onto the first and/or second faces 106, 108 of the glass pane 104 as an icon serigraphy.

The substrate 102 carries the electronic components used in the capacitive touch switch 100. The substrate 102 includes a first surface 116 and an opposing, second surface 118. In FIGS. 1 and 2, the substrate 102 is illustratively embodied as a printed circuit board (PCB), or printed wiring board, 102. PCB 102 may include wiring and electronic components on one or both sides of the board. In some embodiments, the PCB 102 has a thickness of approximately 1.6 millimeters. In other embodiments, the PCB 102 has a thickness of approximately 0.8 millimeters, which provides increased flexibility.

The PCB 102 has been provided with a cut-out channel 120 which extends through the thickness of PCB 102 from the first surface 116 to the second surface 118. The channel 120 may have any suitable width, including a negligible width when the material of PCB 102 has been merely cut (but material has not been removed). The channel 120 creates a flexible section or pad 122 which can be deflected from the remainder of the PCB 102. The channel 120 may follow any number of shapes and, thus, the flexible pad 122 defined by the channel 120 may also take any number of shapes. In some embodiments, the flexible pad 122 will have the general form of an N-sided polygon (where N can be any integer greater than or equal to 3). In such cases, the channel 120 will trace all sides of the N-sided polygon except one (i.e., N−1 sides). The side of the flexible pad 122 which is attached to the remainder of the PCB 102 may be considered a first end 124 of the flexible pad 122. The opposite end of the flexible pad 122 may be considered a second end 126. In some embodiments, the width of the flexible pad 122 may vary between the first and second ends 124, 126. For instance, the flexible pad 122 illustrated in FIG. 1 has a first, narrower width near the first end 124 and a second, wider width near the second end 126.

A capacitive electrode 128 is disposed on the flexible pad 122. The capacitive electrode 128 may be formed of any conductive material, such as a metal, which will capacitively couple with a user 200 who touches the switch 100. The capacitive electrode 128 may be printed on either surface 116, 118 of the flexible section 122 of the PCB 102. Where the capacitive electrode 128 is disposed on the first surface 116, a reflective material 130 may be used to at least partially cover the capacitive electrode 128. The reflective material 130 may be any substance which reflects or diffuses the spectrum of visible light or, at least, the wavelengths of light which are used to illuminate the icon 114 in the capacitive touch switch 100. In FIGS. 1 and 2, the reflective material 130 is illustratively embodied as a white paint 130 which is applied to substantially the entire area above the capacitive electrode 128. In using the term "paint," this disclosure refers to any liquid, liquifiable, or mastic composition which, after application to a substrate in a thin layer, is converted to an opaque solid film.

A light source 132 is also coupled the flexible pad 122. In some embodiments, the light source 132 may be coupled to the first surface 116 of the flexible pad 122 (i.e., at least a portion of the light source 132 resides on the first surface 116). The light source 132 may be located near the second end 126 of the flexible pad 122, but other orientations are possible. The light source 132 may include any generator of visible light, such as lamps, bulbs, vacuum fluorescents, and light-emitting diodes (LED), by way of example. Furthermore, the light source 132 may include a single generator or multiple generators of visible light. In the presently disclosed embodiments, the light source 132 is illustratively embodied as a single low-profile, side-mounted LED 132. The LED 132 may have several, distinct levels of illumination (e.g., an "off" level, a low level, an intermediate level, a high level, etcetera), which may be used to inform a user 200 when the switch 100 is inactive, active, or selected.

When assembling the capacitive touch switch 100, a manufacturer would first align the PCB 102 with the glass pane 104. Where the thin film 110 has been disposed on the glass pane 104 (or the icon serigraphy has been printed directly on the glass pane 104), the icon 114 will be aligned over the flexible pad 122, the capacitive electrode 128, the white paint 130 (when used), and the LED 132, as illustrated in FIG. 1. After aligning the PCB 102 and the glass pane 104, the manufacturer will urge the first face 106 of the glass pane 104 into contact with the first surface 116 of the PCB 102. Urging the PCB 102 and the glass pane 104 into contact may include moving either or both of the PCB 102 and the glass pane 104 toward the other. The first face 106 of the glass pane 104 will contact only the portion of the first surface 116 of the PCB 102 which is outside the channel 120 (i.e., the portion of PCB 102 other than the flexible section 122). The glass pane 104 may be secured to this portion of the PCB 102 by any known method, such as adhesive or mechanical attachment.

In the embodiment illustrated in FIGS. 1 and 2, the LED 132 coupled to the flexible pad 122 engages the glass pane 104 and causes the second end 126 of the flexible pad 122 to be deflected away from the glass pane 104 when the glass pane 104 is urged into contact with the PCB 102. As illustrated in FIG. 2, this deflection of the flexible pad 122 creates a gap 202 in the interior of the capacitive touch switch 100. The gap 202 may be, but need not be, filled with a light-transmitting material. In the illustrative embodiment of FIGS. 1 and 2, no such material is added. Thus, the capacitive touch switch 100 contains an air-gap 202 which allows the light from the LED 132 to reflect off the white paint 130 and pass through both the glass pane 104 and the semi-transparent area 112 of the thin film 110 (illuminating the icon 114 to the user 200).

As will be appreciated by those of ordinary skill in the art, the capacitive touch switch 100 illustrated in FIGS. 1 and 2 may include elements other than those shown and described above, such as, by way of example, a control circuit coupled to the second surface 118 of the printed circuit board 102. The control circuit may receive electrical signals from the capacitive electrode 128 to sense when a user 200 has approached the capacitive touch switch 100 and may provide electrical signals to the light source 132 to control illumination of the switch 100. It should also be appreciated that the location of many components may also be altered.

Figure 3:
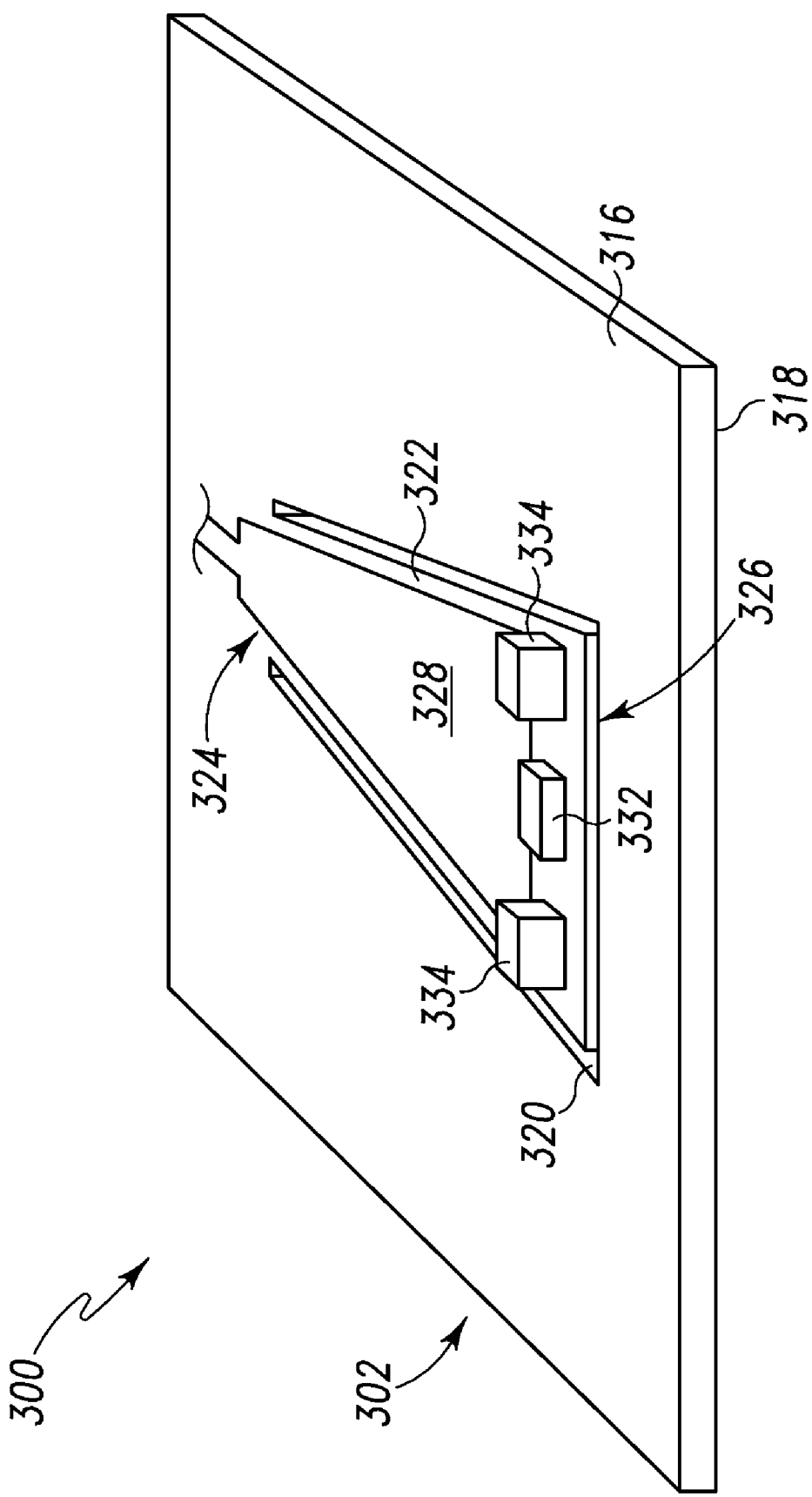
FIG. 3 is a perspective view of a portion of a capacitive touch switch according to another embodiment.

Several components of a capacitive touch switch 300, differing in several respects from the capacitive touch switch 100, are illustrated in FIG. 3. These illustrated components may be combined with components similar to the insulating panel 104, the generally opaque layer 110, and the reflective material 130 shown in FIGS. 1 and 2 to assemble the capacitive touch switch 300. Capacitive touch switch 300 includes a substrate 302, which is illustratively embodied as a PCB 302 including a first surface 316 and an opposing, second surface 318. The PCB 302 has also been provided with a cut-out channel 320 which extends through the thickness of PCB 302 from the first surface 316 to the second surface 318. As with the previous embodiment, the channel 320 creates a flexible section or pad 322 which can be deflected from the remainder of the PCB 302.

The capacitive touch switch 300 shown in FIG. 3 illustrates another of the many shapes which the channel 320 may follow. In this embodiment, the channel 320 defines a flexible pad 322 having the general form of a 4-sided polygon (namely, a trapezoid). The channel 320 traces three sides of the 4-sided polygon. At a first end 324, the flexible pad 322 is attached to the remainder of the PCB 302. The width of the flexible pad 322 increases from the first end 324 to the opposite, second end 326. A capacitive electrode 328 is printed on the flexible pad 322, and an LED 332 is soldered to the first surface 316 near the second end 326 of the flexible pad 322.

The features and operation of the capacitive electrode 328 and the LED 332 are substantially as described above with respect to FIGS. 1 and 2.

As illustrated in FIG. 3, the flexible pad 322 further includes a number of spacers 334 secured to the first surface 316 of the flexible pad 322. While any number of spacers 334 may be used, the capacitive touch switch 300 illustratively includes two spacers 334 located near the second end 326 of the flexible pad 322. The spacers 334 may be formed of any suitable material and will typically be formed of an opaque, insulating material, such as a plastic. In some embodiments, the spacers 334 have a height greater than the height of the LED 332 and, thus, extend further above the flexible pad 322 than the LED 332.

When assembling the capacitive touch switch 300, a manufacturer would align the PCB 302 with an insulating panel (not shown) and urge these components into contact, in a manner similar to that described above with respect to FIGS. 1 and 2. In contrast to the previous embodiment, however, the LED 332 will not engage the insulating panel. Instead, the spacers 334 secured to the flexible pad 322 will engage the insulating panel and cause the second end 326 of the flexible pad 322 to be deflected away when the insulating panel is urged into contact with the PCB 302. Thus, the spacers 334 may protect the LED 332 from undergoing the force of this deflection. Deflection of the flexible pad 322 creates a gap in the interior of the capacitive touch switch 300 which allows for the transmission of light from the LED 332 and the illumination of an icon disposed on the capacitive touch switch 300.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present invention and fall within the spirit and scope of the present disclosure as defined by the appended claims.

The invention claimed is:

1. A capacitive touch switch comprising:
   a substrate having a first surface and a second surface, the substrate including a channel which extends between the first and second surfaces and defines a flexible section of the substrate;
   a capacitive electrode disposed on the flexible section of the substrate;
   an insulating panel secured to a portion of the first surface of the substrate, the insulating panel having an icon disposed thereon in proximity to the capacitive electrode; and
   a light source coupled to the first surface of the flexible section of the substrate and engaged with the insulating panel such that the flexible section of the substrate is deflected away from the insulating panel.

2. The capacitive touch switch of claim 1, wherein the substrate comprises a printed circuit board.

3. The capacitive touch switch of claim 2, wherein the printed circuit board has a thickness of no greater than 1 millimeter.

4. The capacitive touch switch of claim 1, further comprising a control circuit coupled to the second surface of the substrate and electrically connected to both the capacitive electrode and the light source.

5. The capacitive touch switch of claim 1, wherein the light source comprises a light-emitting diode.

6. The capacitive touch switch of claim 1, wherein the light source comprises a plurality of light-emitting diodes.

7. The capacitive touch switch of claim 1, wherein the capacitive electrode is disposed on the first surface of the flexible section of the substrate.

8. The capacitive touch switch of claim 7, further comprising a reflective material at least partially covering the capacitive electrode.

9. The capacitive touch switch of claim 8, wherein the reflective material comprises a paint.

10. The capacitive touch switch of claim 1, wherein the flexible section of the substrate has the shape of an N-sided polygon and the channel which defines the flexible section traces N−1 sides of the polygon.

11. The capacitive touch switch of claim 10, wherein the flexible section of the substrate has at least a first width and a second width, the second width being larger and nearer to the light source than the first width.

12. A method of manufacturing a capacitive touch switch, the method comprising:
   aligning (i) an insulating panel having a first face and a second face, the second face adapted to be touched by a user, and (ii) a substrate having a channel formed between a first surface and a second surface of the substrate, the channel defining a flexible section of the substrate; and
   urging the first face of the insulating panel into contact with a portion of the first surface of the substrate such that the flexible section of the substrate is deflected away from the insulating panel.

13. The method of claim 12, wherein aligning the insulating panel and the substrate comprises bringing an icon disposed on the insulating panel into alignment with a capacitive electrode disposed on the flexible section of the substrate.

14. The method of claim 12, further comprising applying a reflective material to at least partially cover a capacitive electrode disposed on the first surface of the flexible section of the substrate.

15. The method of claim 12, wherein one or more light sources coupled to the first surface of the flexible section of the substrate cause the flexible section to be deflected away from the insulating panel when the first face of the insulating panel is urged into contact with a portion of the first surface of the substrate.

16. The method of claim 12, wherein one or more spacers coupled to the first surface of the flexible section of the substrate cause the flexible section to be deflected away from the insulating panel when the first face of the insulating panel is urged into contact with a portion of the first surface of the substrate.

17. A capacitive touch switch, comprising:
   a printed circuit board having a channel formed therein, the channel extending through the thickness of the printed circuit board and defining a flexible pad in the printed circuit board;
   a capacitive electrode printed on the flexible pad;
   at least one light-emitting diode soldered to the flexible pad;
   a glass pane having an icon serigraphy, the glass pane secured to a portion of the printed circuit board; and
   at least one spacer secured to the flexible pad, the at least one spacer extending further above the flexible pad than the at least one light-emitting diode such that the flexible pad is deflected away from the glass pane by the at least one spacer.

18. The capacitive touch switch of claim 17, wherein the thickness of the printed circuit board is no greater than 1 millimeter.

19. The capacitive touch switch of claim 17, further comprising a layer of paint at least partially covering the capacitive electrode, the layer of paint capable of reflecting light produced by the light-emitting diode.

20. The capacitive touch switch of claim 17, wherein the channel borders each side of the flexible pad except at a first end and the at least one spacer is located near a second end of the flexible pad, opposite the first end.

* * * * *